(12) United States Patent  
Lee (10) Patent No.: US 8,754,413 B2  
(45) Date of Patent: Jun. 17, 2014

(54) X-RAY DETECTION DEVICE

(75) Inventor: Kyung Soo Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 300 days.

(21) Appl. No.: 13/297,691

(22) Filed: Nov. 16, 2011

(65) Prior Publication Data

US 2012/0168759 A1  Jul. 5, 2012

(30) Foreign Application Priority Data

Dec. 29, 2010 (KR) .................. 10-2010-0138055

(51) Int. Cl.
  *H01L 27/14* (2006.01)
(52) U.S. Cl.
  USPC ............. 257/59; 257/72; 257/443; 257/444; 257/E27.146
(58) Field of Classification Search
  USPC ........ 257/59, 72, E27.14, E27.146, 443, 444; 250/370.12, 370.14, 370.09
  See application file for complete search history.

(56) References Cited

U.S. PATENT DOCUMENTS

| 5,319,206 A | 6/1994 | Lee et al. |
| 5,512,756 A | 4/1996 | Bayer et al. |
| 8,492,728 B2* | 7/2013 | Antonuk ............. 250/370.11 |
| 2008/0302970 A1* | 12/2008 | Fujieda et al. ......... 250/370.11 |

FOREIGN PATENT DOCUMENTS

| CN | 1113322 A | 12/1995 |
| JP | 4-037917 | 2/1992 |
| JP | 07-209431 | 8/1995 |
| JP | 2002-246577 | 8/2002 |
| KR | 10-2001-0063769 A | 7/2001 |

* cited by examiner

*Primary Examiner* — Minh-Loan T Tran  
(74) *Attorney, Agent, or Firm* — Lee & Morse, P.C.

(57) ABSTRACT

An X-ray detection device includes a gate electrode and a lower electrode on a substrate and laterally spaced from each other, a dielectric layer covering the gate electrode and the lower electrode, and a conductive pattern on the dielectric layer at a side of the gate electrode adjacent to the lower electrode and overlapping the lower electrode. The device also includes a source electrode spaced apart from the conductive pattern that is on the dielectric layer at the other side of the gate electrode, and an interlayer insulation layer covering the conductive pattern and the source electrode. A collector electrode, a photoelectric conversion layer, and a bias electrode are sequentially stacked on the interlayer insulation layer.

16 Claims, 11 Drawing Sheets

X-RAY DETECTION DEVICE

CROSS-REFERENCE TO RELATED APPLICATIONS

This U.S. non-provisional patent application claims priority under 35 U.S.C. §119 of Korean Patent Application No. 10-2010-0138055, filed on Dec. 29, 2010, the entire contents of which are hereby incorporated by reference.

BACKGROUND

Embodiments relates to an X-ray detection device. X-ray detection devices are used as, e.g., medical devices for detecting medical conditions. The importance of X-ray detection devices may be high in the medical device industry. Thus, technology is now being developed to provide reliable X-ray detection devices for exact and rapid diagnosis of medical conditions.

SUMMARY

Embodiments may be realized by providing X-ray detection devices that includes a gate electrode and a lower electrode disposed on a substrate and laterally spaced from each other; a dielectric layer covering the gate electrode and the lower electrode; a conductive pattern disposed on the dielectric layer at a side of the gate electrode adjacent to the lower electrode, the conductive pattern extending on the dielectric layer to overlap with the lower electrode; a source electrode disposed on the dielectric layer at the other side of the gate electrode, the source electrode being spaced apart from the conductive pattern; an interlayer insulation layer covering the conductive pattern and the source electrode; and a collector electrode, an photoelectric conversion layer, and a bias electrode that may be sequentially stacked on the interlayer insulation layer.

In some embodiments, the photoelectric conversion layer may include copper (Cu), indium (In), gallium (Ga), and selenium (Se).

In other embodiments, the interlayer insulation layer may include a hole exposing a part of the conductive pattern, and the collector electrode may be conformally formed on bottom and sidewalls of the hole to define a space surrounded by the collector electrode in the hole.

In still other embodiments, the photoelectric conversion layer may fill the space surrounded by the collector electrode.

In even other embodiments, the interlayer insulation layer may include a hole exposing a part of the conductive pattern, and the X-ray detection device may further include a conductive adhesive material filled in the hole.

In yet other embodiments, the X-ray detection device may further include a gate line extending in a first direction on the substrate; and a data line extending in a second direction perpendicular to the first direction on the substrate, wherein the gate electrode may be a portion of the gate line that is protruded from the gate line, and the source electrode may be a portion of the data line that is protruded from the data line.

Embodiments may also be realized by providing X-ray detection devices that include a transistor and a capacitor disposed on a substrate and laterally spaced from each other; a collector electrode on the capacitor; and an photoelectric conversion layer comprising $CuIn_xGa_{(1-x)}Se_2 (0<x<1)$ in the collector electrode, wherein the photoelectric conversion layer includes about 20 to about 30 at % of copper (Cu), about 20 to about 30 at % of $In_xGa_{(1-x)}$, and about 45 to about 55 at % of selenium (Se).

In some embodiments, the photoelectric conversion layer may have a density in a range from about 3.71 $g/cm^3$ to about 7.71 $g/cm^3$.

In other embodiments, the transistor may include a gate electrode on the substrate, a gate insulation layer on the gate electrode, a semiconductor pattern overlapped with the gate insulation layer, and source and drain electrodes disposed on the semiconductor pattern at both sides of the gate electrode; and the capacitor may include a lower electrode on the substrate, a capacitor dielectric layer on the lower electrode, and an upper electrode on the capacitor dielectric layer.

In still other embodiments, the gate insulation layer and the capacitor dielectric layer may be formed of the same material and provided during the same process.

In even other embodiments, the source and drain electrodes and the upper electrode may include the same material and may be provided during the same process.

In yet other embodiments, the X-ray detection device may further include a bias electrode on the photoelectric conversion layer, wherein a voltage applied to the bias electrode is higher than a voltage applied to the collector electrode.

In further embodiments, the X-ray detection device may further include a buffer layer between the photoelectric conversion layer and the bias electrode, wherein the buffer layer may include a material different from the photoelectric conversion layer and the bias electrode.

In still further embodiments, bottom surfaces of the gate electrode and the lower electrode may be on the same level, and the gate electrode and the lower electrode may include different materials.

In even further embodiments, the lower electrode and the collector electrode may include a transparent conductive material.

In yet further embodiments, the photoelectric conversion layer may have a thickness in a range from about 50 μm to about 200 μm.

In some embodiments, the photoelectric conversion layer may have a thickness in a range from about 500 μm to about 2000 μm.

BRIEF DESCRIPTION OF THE DRAWINGS

Features will become apparent to those of ordinary skill in the art by describing in detail exemplary embodiments with reference to the attached drawings in which.

DETAILED DESCRIPTION

Exemplary embodiments will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

It will also be understood that when a layer (or film) is referred to as being 'on' another layer or substrate, it can be directly on the other layer or substrate, or intervening layers may also be present. Also, though terms like a first, a second, and a third are used to describe various regions and layers (or films) in various, the regions and the layers are not limited to these terms. These terms are used only to tell one region or layer from another region or layer (or film). Therefore, a layer referred to as a first layer in one embodiment can be referred to as a second layer in another embodiment. An embodiment described and exemplified herein includes a complementary embodiment thereof. It will also be understood that the term "and/or" as used herein refers to and encompasses any and all possible combinations of one or more of the associated listed items. Like reference numerals refer to like elements throughout the specification.

Figure 1:
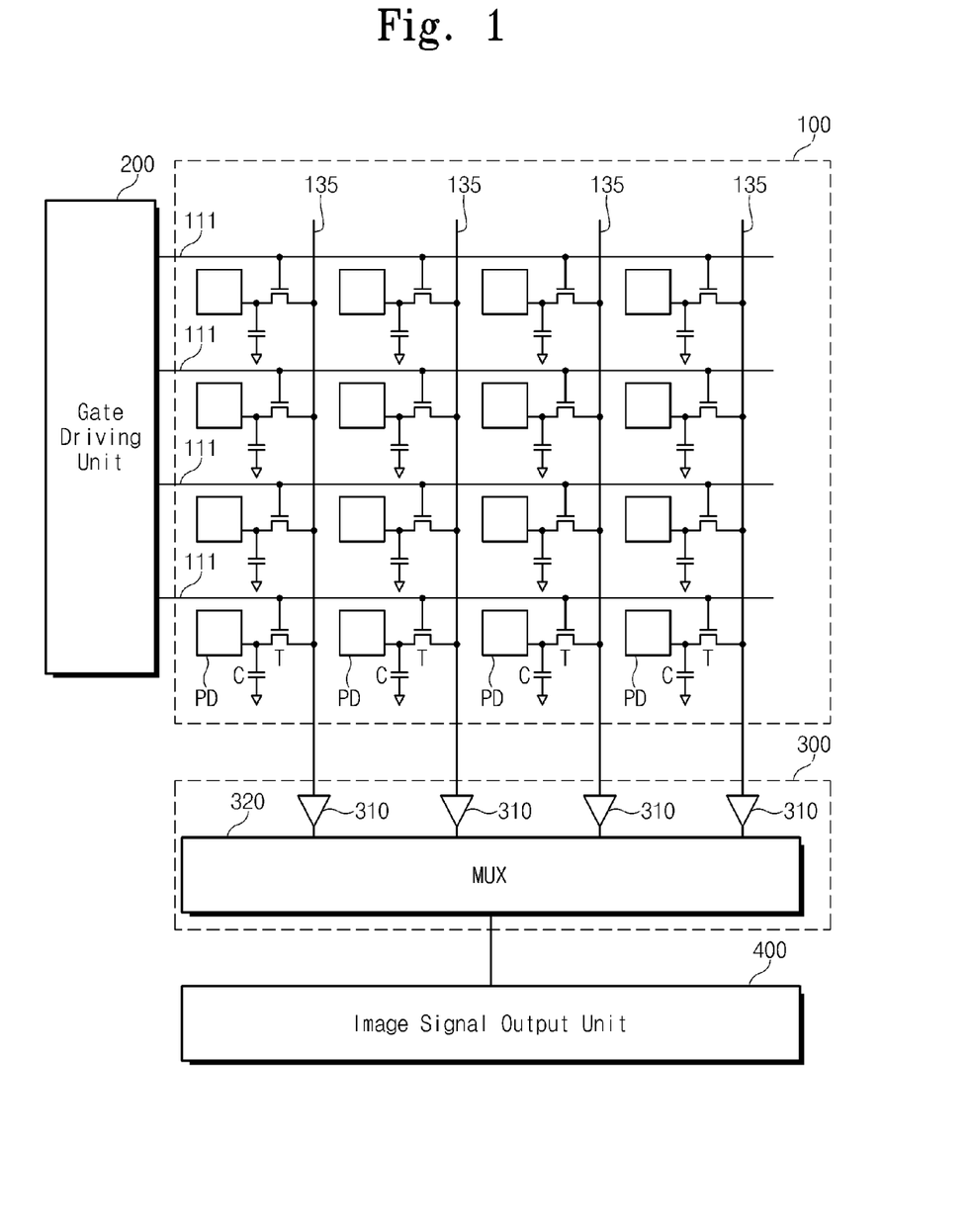
FIG. 1 is a view illustrating an X-ray detection device according to an exemplary embodiment.

An explanation will now be given of an X-ray detection device according to an exemplary embodiment. FIG. 1 is a view illustrating an X-ray detection device according to an exemplary embodiment.

Referring to FIG. 1, the X-ray detection device of an exemplary embodiment may include a detection pixel array 100, a gate driving unit 200, a data processing unit 300, and an image signal output unit 400.

If X-rays are incident on the detection pixel array 100, the detection pixel array 100 may generate and store X-ray detection voltages and may send the X-ray detection voltages to the data processing unit 300. The detection pixel array 100 may include a plurality of gate lines 111, a plurality of data lines 135, a plurality of switching devices, a plurality of X-ray detection voltage storage devices, and a plurality of photo detection sections PD. The switching devices may be transistors (T), and the X-ray detection voltage storage devices may be capacitors (C). The photo detection sections PD may generate the X-ray detection voltages, and the capacitors (C) may store the X-ray detection voltages. The transistors (T) connected to the gate lines 111 may transmit the X-ray detection voltages to the data processing unit 300 through the data lines 135.

The gate lines 111 may extend in a first direction in parallel with each other. The gate lines 111 may be spaced apart from each other in a second direction. The second direction may intersect, e.g., may be perpendicular to, the first direction. The data lines 135 may extend in the second direction substantially in parallel with each other. The data lines 135 may be spaced apart from each other in the first direction. The gate lines 111 extending in the first direction may be connected to the gate driving unit 200. The data lines 135 extending in the second direction may be connected to the data processing unit 300.

The transistors (T) and the capacitors (C) may be arranged along the first and second directions in, e.g., a matrix format. A detection pixel may be defined by a transistor (T), a capacitor (C), and a photo detection section PD. Detection pixels may be arranged among the neighboring gate lines 111 and the neighboring data lines 135. Detection pixels arranged in the first direction may form rows and detection pixels arranged in the second direction may form columns. The gate lines 111 may extend among the neighboring rows, and the data lines 135 may extend among the neighboring columns. The detection pixel array 100 may include a plurality of rows that are spaced apart from each other in the second direction and a plurality of columns that are spaced apart from each other in the first direction.

Each of the transistors (T) may be connected to a gate line 111 and a data line 135. Transistors (T) included in the same row may be connected to the same gate line 111. Transistors (T) included in the same column may be connected to the same data line 135. Gate electrodes of the transistors (T) may be electrically connected to the gate lines 111, and sources of the transistors (T) may be electrically connected to the data lines 135. The capacitors (C) may be connected to drains of the transistors (T).

The photo detection sections PD may include a material capable of converting an incident X-ray into an electric signal. For example, the photo detection sections PD may include each of or at least one of copper (Cu), indium (In), gallium (Ga), and selenium (Se). If X-rays are incident on the photo detection sections PD, the photo detection sections PD may generate X-ray detection voltages. The X-ray detection voltages may be stored in the capacitors (C). For example, electron-hole pairs may be generated in the photo detection sections PD by an incident X-ray, and holes or electrons may be stored in the neighboring capacitors (C).

The gate driving unit 200 may select one of the gate lines 111 and may apply a gate signal to the selected gate line 111. For example, the gate driving unit 200 may apply a gate signal to the gate lines 111 sequentially in the second direction. Transistors (T) connected to the selected gate line 111 to which the gate signal is applied may be turned on, and the other transistors (T) connected to the non-selected gate lines 111 to which the gate signal is not applied may be turned off. Transistors (T) connected to the same row may be simultaneously turned on or off. The X-ray detection voltages stored in the capacitors (C) connected to the turned-on transistors (T) may be input to the data processing unit 300 through the data lines 135.

The data processing unit 300 may include amplifiers 310 connected to respective data lines 135, and multiplexers (MUX) 320 connected to the amplifiers 310. The X-ray detection voltages may be input to the amplifiers 310 through the data lines 135. The amplifiers 310 may amplify the X-ray detection voltages, and the amplified X-ray detection voltages may be input to the multiplexers 320. The multiplexers 320 may transmit the X-ray detection voltages to the image signal output unit 400. The image signal output unit 400 may output an image signal corresponding to the X-ray detection voltages.

Figure 2:
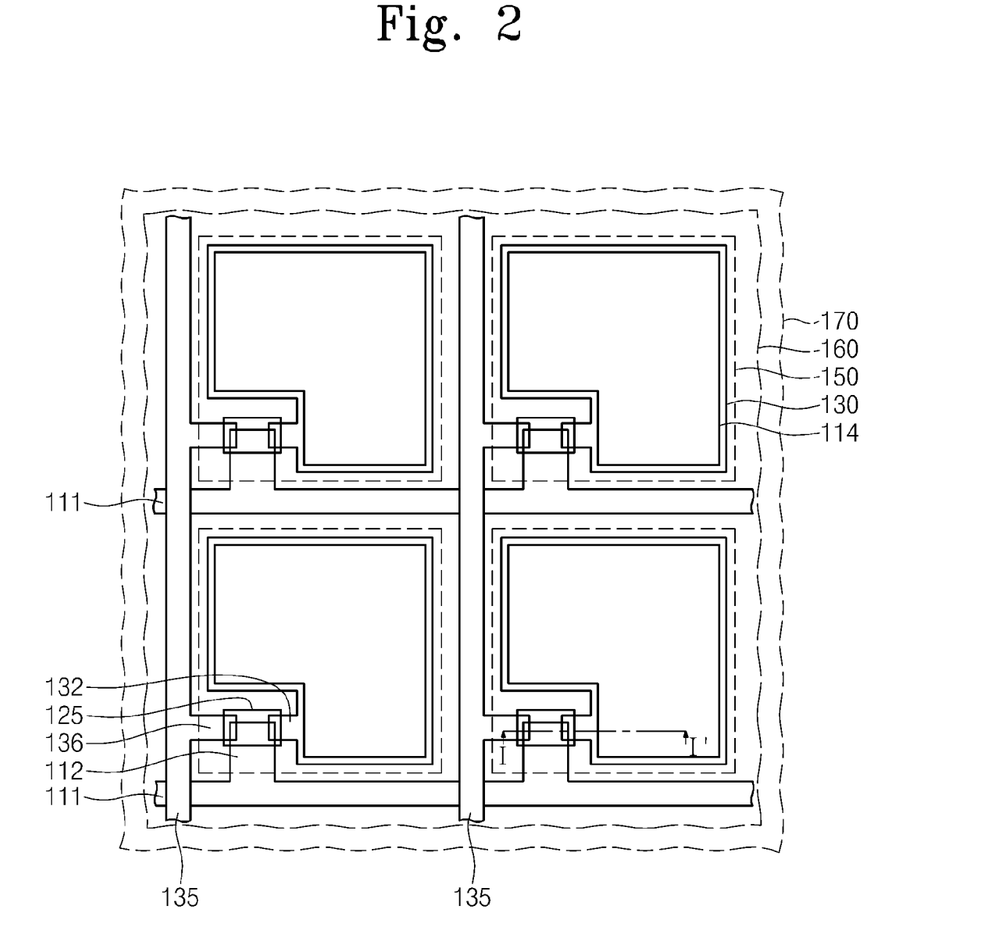
FIG. 2 is a view illustrating a detection pixel array of the X-ray detection device according to an exemplary embodiment.
Figure 3:
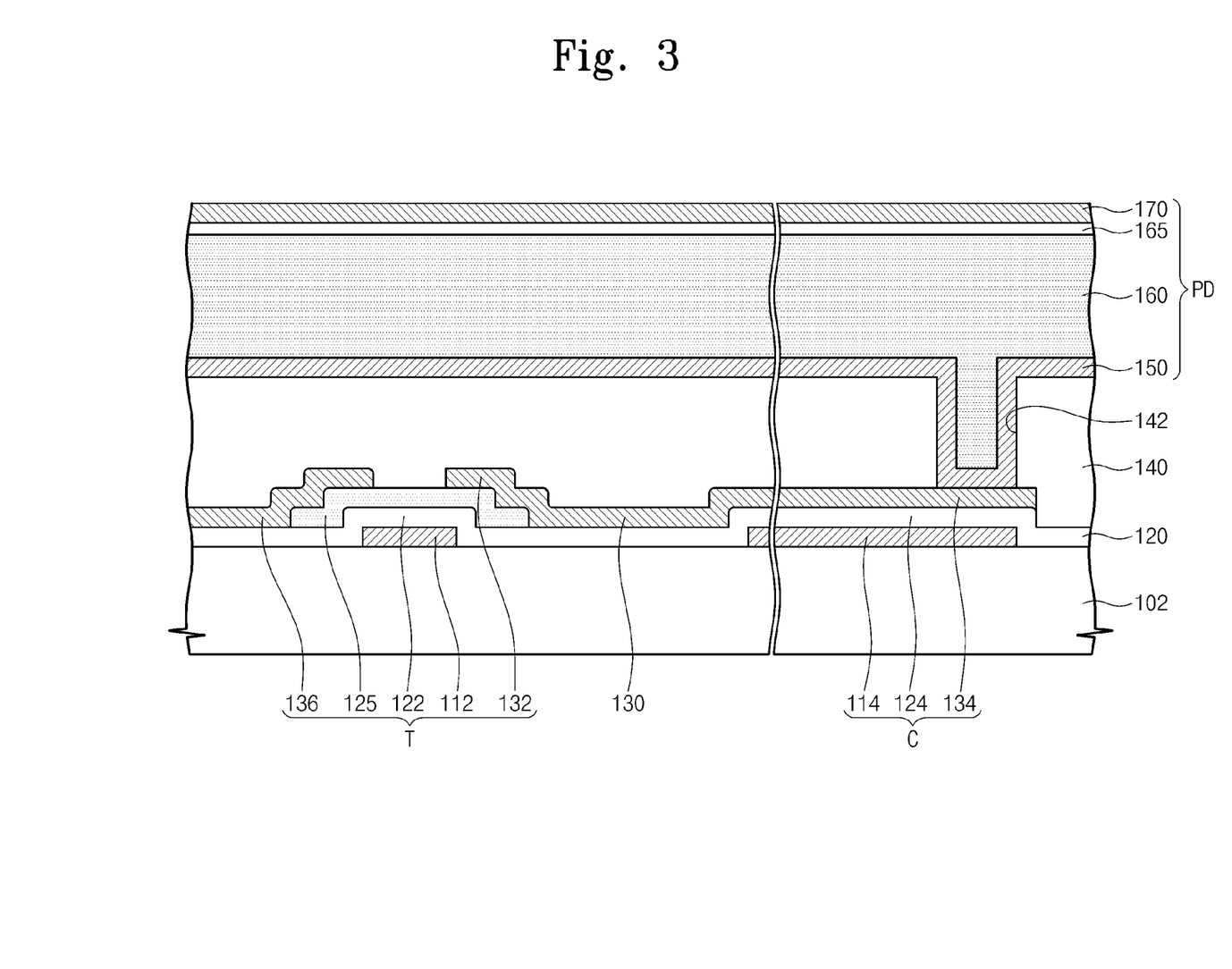
FIG. 3 is a view illustrating a detection pixel of the X-ray detection device according to an exemplary embodiment.

The detection pixel array 100 of the X-ray detection device will now be described in more detail according to an exemplary embodiment. FIG. 2 is a view illustrating the layout of the detection pixel array 100 of the X-ray detection device according to an exemplary embodiment, and FIG. 3 is a view for explaining a detection pixel of the X-ray detection device according to an exemplary embodiment. FIG. 3 is a sectional view taken along line I-I' of FIG. 2.

Referring to FIGS. 2 and 3, the gate lines 111 may extend on a substrate 102 in the first direction, and the data lines 135 may extend in the second direction perpendicular to the first direction. A detection pixel may be disposed in each region surrounded by the neighboring gate lines 111 and the data lines 135. The detection pixel may include a transistor (T), a capacitor (C), and a photo detection section PD.

The transistor (T) may include a gate electrode 112 on the substrate 102, a gate insulation layer 122 on the gate electrode 112, a semiconductor pattern 125 overlapped with the gate insulation layer 122, and source and drain electrodes 136 and 132 disposed on the semiconductor pattern 125 at both sides of the gate electrode 112.

The capacitor (C) may include a lower electrode 114 on the substrate 102, a capacitor dielectric layer 124 on the lower electrode 114, and an upper electrode 134 on the capacitor dielectric layer 124.

The photo detection section PD may include a collector electrode 150, a photoelectric conversion layer 160 on the collector electrode 150, and a bias electrode 170 on the photoelectric conversion layer 160. A buffer layer 165 may be additionally disposed between the bias electrode 170 and the photoelectric conversion layer 160. The collector electrode 150 may cover the transistor (T) and the capacitor (C) of the detection pixel. Each of or at least one of the photoelectric conversion layer 160, the buffer layer 165, and the bias electrode 170 may cover substantially the entire surface of the substrate 102 on which the transistor (T), the capacitor (C), the gate lines 111, and the data lines 135 are disposed.

The substrate 102 may be formed of an insulation material. For example, the substrate 102 may be formed of glass, quartz, or plastic.

The gate lines 111 extending in the first direction may have parts protruding in the second direction, e.g., the gate electrode 112 may be the protruding part of the gate lines 111. The gate lines 111 and the gate electrode 112 may be formed during the same process. The gate lines 111 and the gate electrode 112 may be formed of the same material. The gate lines 111 and the gate electrode 112 may have a single layer structure or a multilayer structure. The gate lines 111 and the gate electrode 112 may include at least one of aluminum (Al), silver (Ag), copper (Cu), molybdenum (Mo), chromium (Cr), titanium (Ti), and tantalum (Ta).

The lower electrode 114 may be disposed on the substrate 102 and may be laterally spaced apart from the gate electrode 112. The bottom surface of the lower electrode 114 and the bottom surface of the gate electrode 112 may be on the same level from the top surface of the substrate 102, e.g., the bottom surfaces of the lower electrode 114 and the gate electrode 112 may be in a same plane on the substrate 102. The lower electrode 114 and the gate electrode 112 may be formed during different processes. The lower electrode 114 may be formed of a material different from that used to form the gate electrode 112. Alternatively, the lower electrode 114 may be formed during the same process as the gate electrode 112. The lower electrode 114 may be formed of a same material as the gate electrode 112.

The lower electrode 114 may be formed of a transparent conductive material. For example, the lower electrode 114 may include at least one of indium tin oxide and indium zinc oxide.

A dielectric layer 120 may cover the gate electrode 112 and the lower electrode 114. The dielectric layer 120 may also cover the gate lines 111. The gate insulation layer 122 may be a part of the dielectric layer 120 disposed on the gate electrode 112. The capacitor dielectric layer 124 may be a part of the dielectric layer 120 disposed on the lower electrode 114.

Therefore, the gate insulation layer 122 and the capacitor dielectric layer 124 may be formed during same process and the same material. The dielectric layer 120 may be formed of an inorganic insulation material. For example, the dielectric layer 120 may include at least one of a silicon oxide, a silicon nitride, and a silicon oxynitride. Alternatively, the dielectric layer 120 may be formed of an organic insulation material. For example, the dielectric layer 120 may include an organic insulation material composed of benzocyclobutene and/or an acryl-containing resin.

The semiconductor pattern 125 may be disposed on the gate insulation layer 122 such that the semiconductor pattern 125 overlaps with the gate electrode 112. The semiconductor pattern 125 may include amorphous silicon or polycrystalline silicon. Alternatively, the semiconductor pattern 125 may include a compound semiconductor material. A channel region may be defined in a part of the semiconductor pattern 125 overlapping the gate electrode 112. If a voltage is applied to the gate electrode 112, a channel may be formed in the channel region of the semiconductor pattern 125.

A conductive pattern 130 may extend to the capacitor dielectric layer 124 from a part of the semiconductor pattern 125 disposed at a side of the gate electrode 112 adjacent to the capacitor (C). The drain electrode 132 may be a part of the conductive pattern 130 disposed on the semiconductor pattern 125 at the side of the gate electrode 112. The upper electrode 134 may be a part of the conductive pattern 130 overlapped with the capacitor dielectric layer 124. Therefore, the drain electrode 132 and the upper electrode 134 may be formed of the same material and provided during the same process.

The source electrode 136 may be disposed on the semiconductor pattern 125 at the other side of the gate electrode 112. The data lines 135 extending in the second direction may have parts protruding in the first direction, and the source electrode 136 may be the protruding part of the data lines 135 which overlaps the semiconductor pattern 125 at the other side of the gate electrode 112.

The conductive pattern 130 and the source electrode 136 may be formed during the same process. The conductive pattern 130 and the source electrode 136 may be formed of the same material. For example, the conductive pattern 130 and the source electrode 136 may include at least one of molybdenum (Mo), tungsten (W), vanadium (V), chromium (Cr), tantalum (Ta), and titanium (Ti).

A contact layer (not shown) may be disposed between the semiconductor pattern 125 and the source electrode 136, and between the semiconductor pattern 125 and the drain electrode 132. The contact layer may include silicide or a semiconductor material doped with a first conductive type dopant.

An interlayer insulation layer 140 may be disposed on the source electrode 136 and the conductive pattern 130 including the drain electrode 132 and the upper electrode 134. The interlayer insulation layer 140 may include a hole 142 exposing a part of the upper electrode 134. The hole 142 may include a bottom surface and sidewalls. The bottom surface of the hole 142 may be the top surface of the upper electrode 134 which is exposed by the hole 142. The interlayer insulation layer 140 may include at least one of a silicon oxide layer, a silicon nitride layer, and a silicon oxynitride layer.

The collector electrode 150 may be formed on the interlayer insulation layer 140 such that the collector electrode 150 uniformly and conformally covers the bottom and sidewalls of the hole 142. In this case, an inner space surrounded by the collector electrode 150 may be defined in the hole 142. The collector electrode 150 may include a transparent conductive material. For example, the collector electrode 150 may include indium tin oxide and/or indium zinc oxide.

The photoelectric conversion layer 160 may be disposed on the collector electrode 150 such that the photoelectric conversion layer 160 fills, e.g., substantially completely fills, the inner space defined in the hole 142. The photoelectric conversion layer 160 may include a protrusion part that fills the inner space. The photoelectric conversion layer 160 may include a material capable of converting incident light into an electric signal. For example, the photoelectric conversion layer 160 may include a CIGS based material including copper (Cu), indium (In), gallium (Ga), and selenium (Se). For example, the photoelectric conversion layer 160 may include $CuIn_xGa_{(1-x)}Se_2(0<x<1)$. In this case, the photoelectric conversion layer 160 may include about 20 to about 30 at % (atomic percent) of copper (Cu), about 20 to about 30 at % of $In_xGa_{(1-x)}$, and about 45 to about 55 at % of selenium (Se). However, embodiments are not limited thereto and the atomic percent ranges may be within ranges that include, but are not limited to, about 23 to about 27 at % of copper (Cu), about 23 to about 27 at % of $In_xGa_{(1-x)}$, and about 48 to about 52 at % of selenium (Se).

The density of the photoelectric conversion layer 160 may be about 3.71 g/cm$^3$ to about 7.71 g/cm$^3$. However, embodiments are not limited thereto and the range of the density may be within ranges that include, but are not limited to, about 4.00 g/cm$^3$ to about 7.00 g/cm$^3$, about 5.50 g/cm$^3$ to about 6.50 g/cm$^3$, and about 6.00 g/cm$^3$ to about 7.50 g/cm$^3$. The photoelectric conversion layer 160 may include at least one of sulfur (S), tellurium (Te), polonium (Po), antimony (Sb), bismuth (Bi), arsenic (As), phosphorus (P), bromine (Br), and iodine (I). The photoelectric conversion layer 160 may include a PN diode or a PIN diode.

The thickness of the photoelectric conversion layer 160 may be about 500 μm to about 2000 μm. The thickness of the photoelectric conversion layer 160 may be within ranges that include, but are not limited to, about 700 μm to about 1800 μm, and about 1000 μm to about 1500 μm. Alternatively, the thickness of the photoelectric conversion layer 160 may be about 50 μm to about 200 μm. The thickness of the photoelectric conversion layer 160 may be within ranges that include, but are not limited to, about 75 μm to about 150 μm, and 100 μm to about 125 μm. In this case, according to an exemplary embodiment, the X-ray detection device may be used for, e.g., mammography.

The X-ray absorptivity of a CIGS based material may be higher than that of silicon (Si) or amorphous selenium (Se). The X-ray absorptivity may mean the ratio of absorbed X-ray intensity to incident X-ray intensity. If the photoelectric conversion layer 160 absorbs an X-ray, electron-hole pairs may be formed in the photoelectric conversion layer 160. As the photoelectric conversion layer 160 has a higher X-ray absorptivity, more electron-hole pairs may be formed in the photoelectric conversion layer 160. Therefore, as described above, without intending to be bound by this theory, if a CIGS based material is used to form the photoelectric conversion layer 160 of the X-ray detection device, a higher X-ray detection voltage can be generated as compared with the case where silicon (Si) or amorphous selenium (Se) is used to form the photoelectric conversion layer 160 of the X-ray detection device. Therefore, according to an exemplary embodiment, the X-ray detection device may be optimized for highly reliable, low power consuming, and rapid operations.

The bias electrode 170 and the photoelectric conversion layer 160 may be spaced apart from each other with the buffer layer 165 being disposed therebetween. The buffer layer 165 may include a material different from the bias electrode 170 and the photoelectric conversion layer 160. For example, the buffer layer 165 may include cadmium sulfide CdS. The buffer layer 165 may be thinner than the photoelectric conversion layer 160. For example, the thickness of the buffer layer 165 may be about 1 nm to about 500 nm.

The bias electrode 170 may include a material different from the collector electrode 150. For example, the bias electrode 170 may include at least one of aluminum (Al), titanium (Ti), copper (Cu), chromium (Cr), tungsten (W), and vanadium (V).

Figure 4:
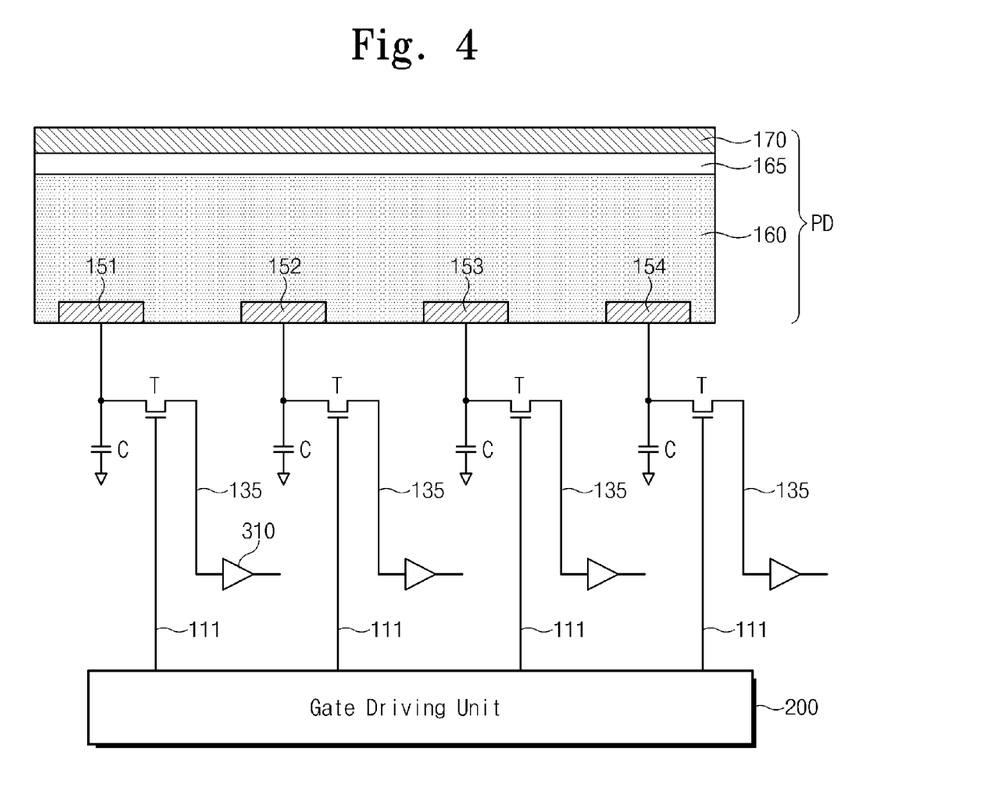
FIG. 4 is a view for explaining generation of X-ray detection voltages in photo detection sections of the X-ray detection device according to an exemplary embodiment.

With respect to FIG. 4, an explanation will be given on how X-ray detection voltages are generated in photo detection sections PD of the X-ray detection device according to an exemplary embodiment. FIG. 4 is a view for explaining generation of X-ray detection voltages in photo detection sections PD of the X-ray detection device according to an exemplary embodiment.

Collector electrodes 151 to 154 (first to fourth collector electrodes 151 to 154) may be spaced apart from each other and connected to capacitors (C). The photoelectric conversion layer 160, the buffer layer 165, and the bias electrode 170 may cover detection pixels (first to fourth detection pixels) of the detection pixel array 100. There may be an electrode potential between the bias electrode 170 and the collector electrodes 151 to 154. For example, if a voltage higher than the voltage levels of the collector electrodes 151 to 154 is applied to the bias electrode 170, an electric potential may be measured between the bias electrode 170 and the collector electrodes 151 to 154. The direction of the electric potential may be from the bias electrode 170 to the collector electrodes 151 to 154. Owing to the electric potential between the bias electrode 170 and the collector electrodes 151 to 154, electrons excited by X-rays incident into the photoelectric conversion layer 160 may be moved to the bias electrode 170 through the buffer layer 165, and holes may be moved to the collector electrodes 151 to 154.

For example, holes generated by an X-ray incident on a position adjacent to the first collector electrode 151 of the first detection pixel may be moved to the first collector electrode 151 and be collected in a capacitor (C) of the first detection pixel. Holes generated by an X-ray incident on a position adjacent to the second collector electrode 152 of the second detection pixel may be moved to the second collector electrode 152 and be collected in a capacitor (C) of the second detection pixel. In this way, holes may be stored in the capacitors (C) so that the capacitors (C) may store X-ray detection voltages. If the gate driving unit 200 inputs a gate signal to transistors (T), the transistors (T) are turned on so that the X-ray detection voltages stored in the capacitors (C) may be transmitted to the amplifiers 310.

Figure 5A:
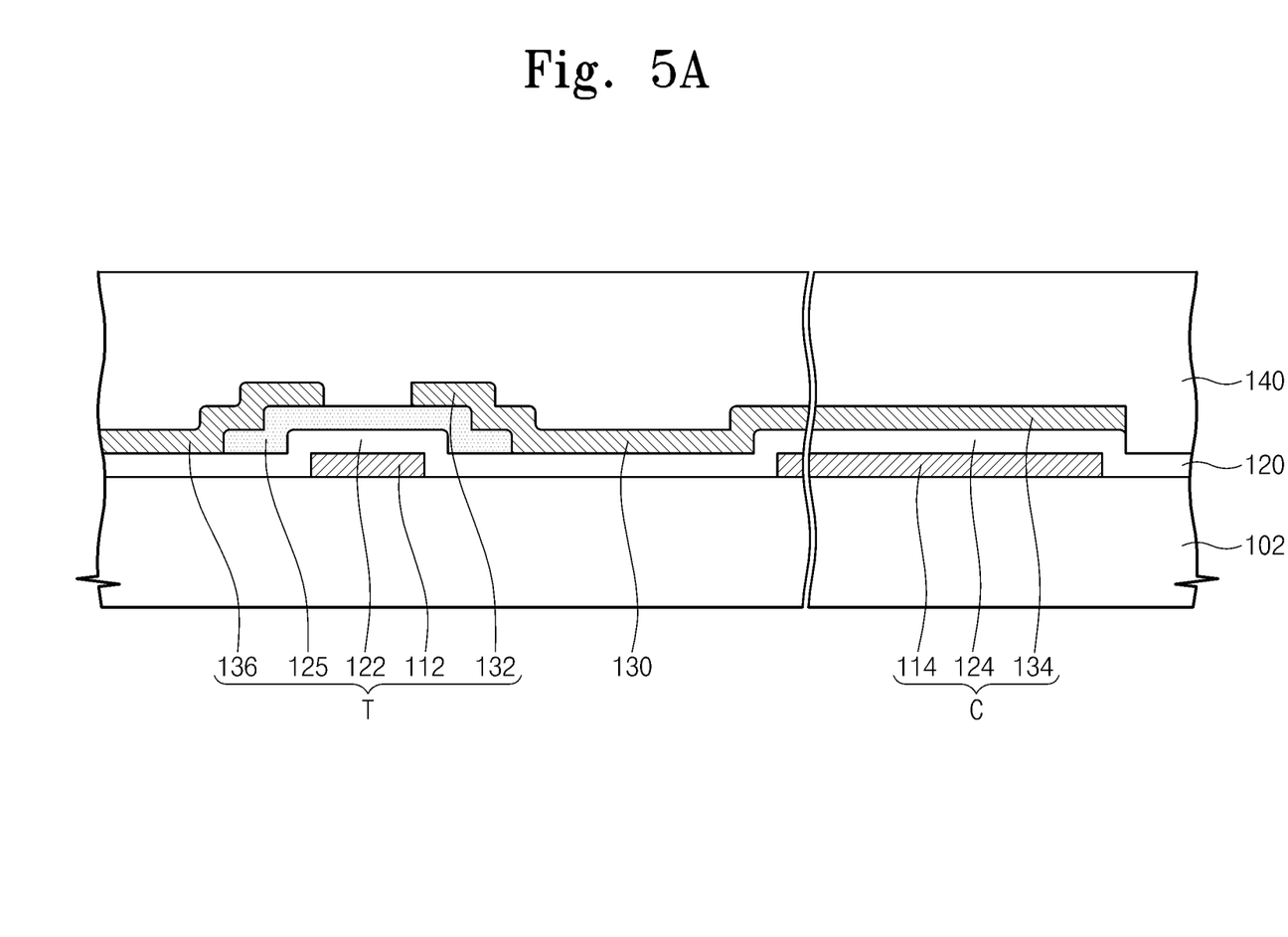
FIGS. 5A and 5B are views for explaining a method of manufacturing the X-ray detection device according to an exemplary embodiment.
Figure 5B:
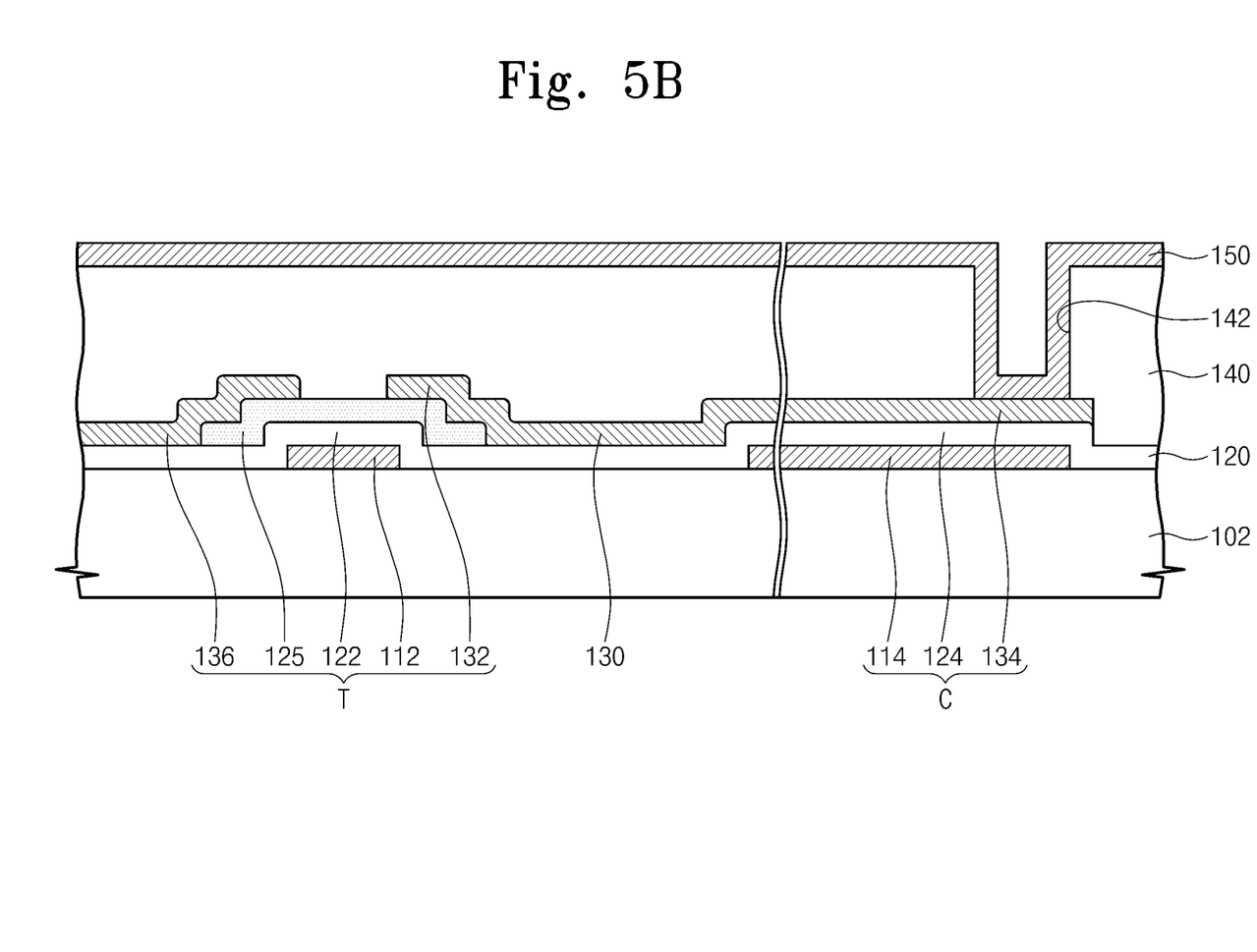

An explanation will now be given on a method of manufacturing the X-ray detection device according to an exemplary embodiment. FIGS. 5A and 5B are sectional views for explaining a method of manufacturing the X-ray detection device according to an exemplary embodiment.

Referring to FIG. 5A, a gate electrode 112 and a lower electrode 114 may be formed on a substrate 102. The gate electrode 112 and the lower electrode 114 may be spaced apart from each other. The gate electrode 112 and the lower electrode 114 may be formed of different materials through different processes. The gate electrode 112 may be formed prior to the lower electrode 114. Alternatively, the lower electrode 114 may be formed prior to the gate electrode 112. Unlike this, the gate electrode 112 and the lower electrode 114 may be formed during same process. For example, conductive layer is formed on the substrate 102 and thereafter the conductive layer may be patterned to form the gate electrode 112 and the lower electrode 114.

A dielectric layer 120 may be formed to cover the gate electrode 112 and the lower electrode 114. The dielectric layer 120 may include a gate insulation layer 122 covering the gate electrode 112 and a capacitor dielectric layer 124 covering the lower electrode 114.

A semiconductor pattern 125 may be formed on the gate insulation layer 122. The semiconductor pattern 125 and the gate electrode 112 may overlap each other. The semiconductor pattern 125 may be formed by forming a semiconductor layer on the entire surface of the substrate 102 and patterning the semiconductor layer. The semiconductor layer may be formed on the substrate 102 by disposing amorphous silicon on the substrate 102 and performing a crystallizing process on the amorphous silicon to form polycrystalline silicon. The crystallizing process may be a heat treatment process. For example, the heat treatment process may be one of an excimer laser annealing (ELA) process, a sequential lateral solidification (SLS) process, and a super grain silicon (SGS) process.

A conductive pattern 130 and a source electrode 136 may be formed on the substrate 102. The conductive pattern 130 and the source electrode 136 may include the same material and may be formed during the same process. The conductive pattern 130 and the source electrode 136 may be formed by forming a conductive layer on the substrate 102 and patterning the conductive layer. The conductive pattern 130 may extend to the capacitor dielectric layer 124 from a part of the semiconductor pattern 125 disposed at a side of the gate electrode 112 adjacent to the lower electrode 114.

The conductive pattern 130 may include a drain electrode 132 disposed on the semiconductor pattern 125 at a position above the side of the gate electrode 112, and an upper electrode 134 covering the capacitor dielectric layer 124. The source electrode 136 may be formed on the semiconductor pattern 125 at a position above the other side of the gate electrode 112. In this way, a transistor (T) including the gate electrode 112, the gate insulation layer 122, the semiconductor pattern 125, the source electrode 136, and the drain electrode 132 may be formed. In addition, a capacitor (T) including the lower electrode 114, the capacitor dielectric layer 124, and the upper electrode 134 may be formed at a position spaced apart from the transistor (T). After forming the source electrode 136 and the conductive pattern 130, an interlayer insulation layer 140 may be formed to cover substantially the entire surface of the substrate 102.

Referring to FIG. 5B, a hole 142 may be formed through the interlayer insulation layer 140. The hole 142 may include bottom surface and sidewalls. The bottom surface of the hole 142 may be the top surface of the upper electrode 134. A part of the upper electrode 134 may be exposed by the hole 142. A collector electrode 150 may be formed to uniformly and/or conformally cover substantially the entire top surface of the interlayer insulation layer 140, the bottom surface of the hole 142, and the sidewalls of the hole 142. A space surrounded by the collector electrode 150 may be formed in the hole 142.

Referring to FIG. 3, a photoelectric conversion layer 160 may be formed on the interlayer insulation layer 140. The photoelectric conversion layer 160 may include a protrusion part that fills the space disposed in the hole 142 and surrounded by the collector electrode 150. The protrusion part may extend toward the upper electrode 134. The photoelectric conversion layer 160 may be formed of a CIGS based material including copper (Cu), indium (In), gallium (Ga), and selenium (Se) by a vacuum thermal evaporation method. For example, the photoelectric conversion layer 160 may include $CuIn_xGa_{(1-x)}Se_2 (0<x<1)$. In this case, the photoelectric conversion layer 160 may include about 20 to about 30 at % (atomic percent) of copper (Cu), about 20 to about 30 at % of $In_xGa_{(1-x)}$, and about 45 to about 55 at % of selenium (Se). The density of the photoelectric conversion layer 160 may be about 3.71 $g/cm^3$ to about 7.71 $g/cm^3$. If the photoelectric conversion layer 160 is formed of a CIGS based material, the photoelectric conversion layer 160 may be doped with at least one of sulfur (S), tellurium (Te), polonium (Po), antimony (Sb), bismuth (Bi), arsenic (As), phosphorus (P), bromine (Br), and iodine (I). After forming the photoelectric conversion layer 160, a heat treatment process may be performed. A buffer layer 165 and a bias electrode 170 may be sequentially formed on the photoelectric conversion layer 160.

Unlike the above-described embodiment, a photo detection section PD and an interlayer insulation layer 140 may be bonded together by using a conductive adhesive material. In this case, the photo detection section PD may be formed on a different substrate instead of depositing the photo detection section PD on the substrate 102, and then the photo detection section PD may be bonded to the interlayer insulation layer 140. This will be explained with reference to FIG. 6. In the modification example shown in FIG. 6, the same elements as those of the X-ray detection device of FIG. 3 are denoted by the same reference numerals.

Figure 6:
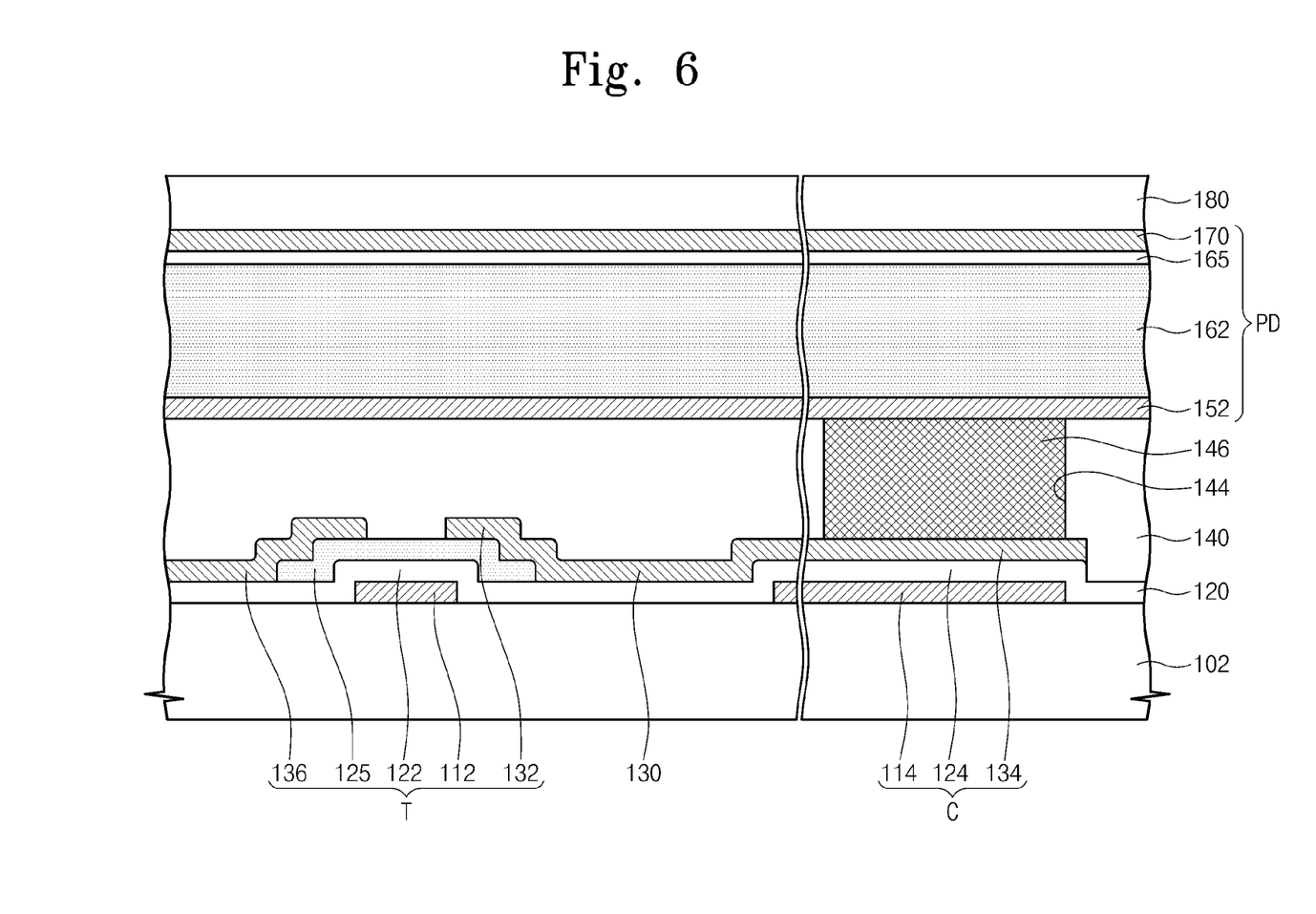
FIG. 6 is a view illustrating a modification example of the X-ray detection device according to an exemplary embodiment.

FIG. 6 is a view illustrating a modification example of the X-ray detection device according to an exemplary embodiment.

Referring to FIG. 6, like in the case shown in FIG. 3, a transistor (T) and a capacitor (C) may be disposed on a substrate 102 and be laterally spaced from each other, and an interlayer insulation layer 140 may be disposed on the transistor (T) and the capacitor (C). The interlayer insulation layer 140 may include a hole 144 exposing a part of an upper electrode 134 of the transistor (T). The hole 144 may be filled with a conductive adhesive material 146. The hole 144 may be substantially entirely filled, e.g., entirely filled, with the conductive adhesive material 146. Unlike that shown in FIG. 6, the conductive adhesive material 146 may be disposed on the top surface of the interlayer insulation layer 140. The conductive adhesive material 146 may include an adhesive polymer.

A collector electrode 152 may be disposed on the interlayer insulation layer 140. The collector electrode 152 may be substantially flat. The collector electrode 152 may make contact with the conductive adhesive material 146. The collector electrode 152 and the upper electrode 134 may be electrically connected through the conductive adhesive material 146. If the conductive adhesive material 146 is disposed on the top surface of the interlayer insulation layer 140, the collector electrode 152 may be spaced apart from the interlayer insulation layer 140. The collector electrode 152 may include the same material as that included in the collector electrode 150 explained with reference to FIG. 3.

A photoelectric conversion layer 162, a buffer layer 165, and a bias electrode 170 may be sequentially disposed on the collector electrode 152. The photoelectric conversion layer 162 may include the same material as that included in the photoelectric conversion layer 160 explained with reference to FIG. 3.

Figure 7:
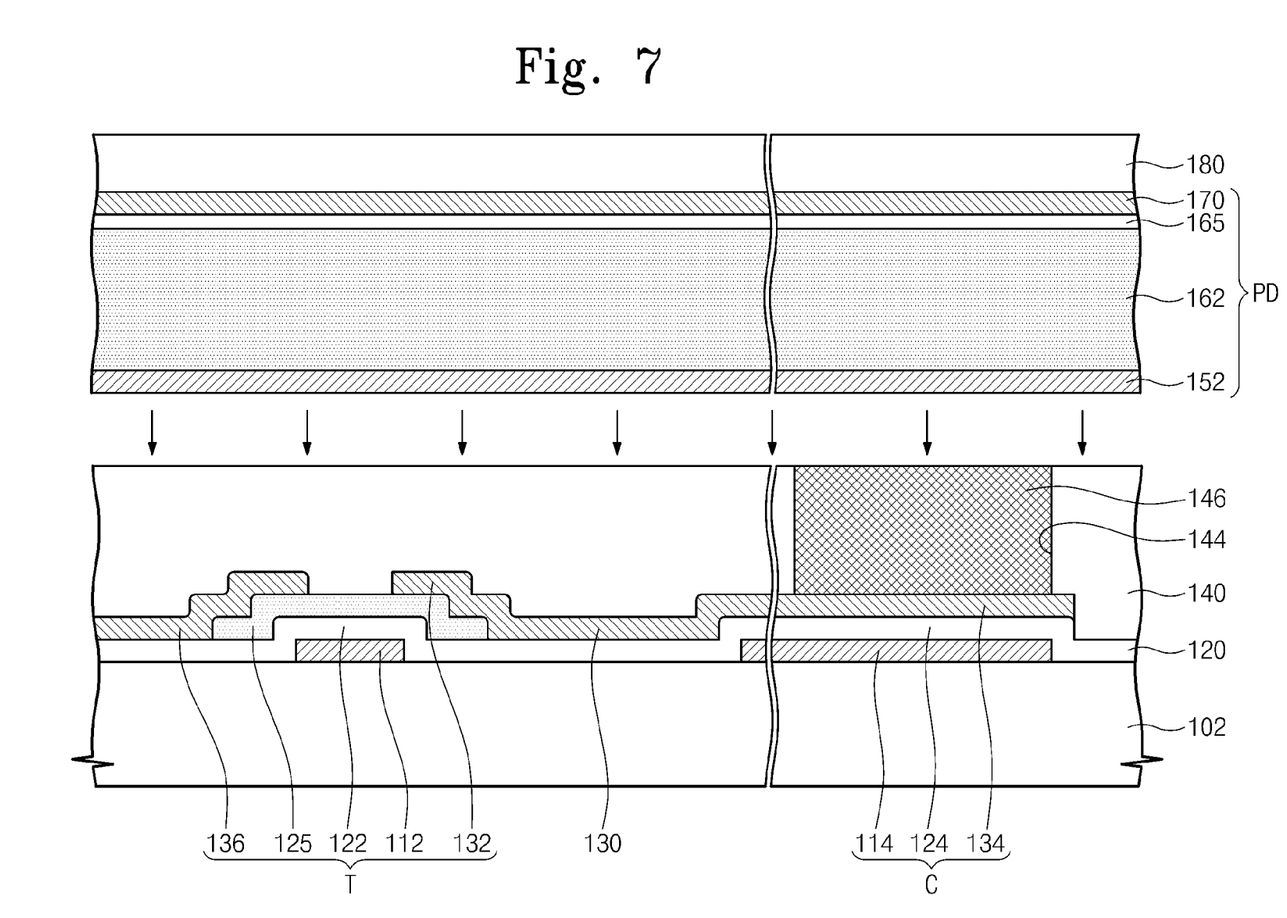
FIG. 7 is a view for explaining a method of manufacturing the modification example of the X-ray detection device according to an exemplary embodiment.

An explanation will now be given on a method of manufacturing the modification example of the X-ray detection device according to another exemplary embodiment. FIG. 7 is a view for explaining a method of manufacturing the modification example of the X-ray detection device according to an exemplary embodiment.

Referring to FIG. 7, like in the case of FIG. 5A, a transistor (T), a capacitor (C), and an interlayer insulation layer 140 may be formed on a substrate 102. A hole 144 may be formed through the interlayer insulation layer 140 to expose a part of an upper electrode 134. The hole 144 may be greater than the hole 142 explained with reference to FIG. 5B. A conductive adhesive material 146 may be filled in the hole 144, e.g., the hole 144 may be substantially completely filled with the conductive adhesive material 146. The conductive adhesive material 146 may be formed on, e.g., directly on, the top surface of the interlayer insulation layer 140.

A bias electrode 170, a buffer layer 165, a photoelectric conversion layer 162, and a collector electrode 152 may be sequentially formed on a support substrate 180. The support substrate 180 may include the same material as that included in the substrate 102. The photoelectric conversion layer 162 may be formed on the buffer layer 165 by the same method as that used to form the photoelectric conversion layer 160 in the embodiment explained with reference to FIG. 5B. The support substrate 180, on which the bias electrode 170, the buffer layer 165, the photoelectric conversion layer 162, and the collector electrode 152 may be sequentially formed, may be turned over so that the collector electrode 152 can be attached to the conductive adhesive material 146.

In a modified exemplary embodiment, the photoelectric conversion layer 162 may not be deposited on the substrate 102 where the transistor (T) and the capacitor (C) are formed, but may be deposited on the support substrate 180 and bonded to the interlayer insulation layer 140 by the conductive adhesive material 146. Thus, a highly reliable X-ray detection device may be provided.

If the photoelectric conversion layer 162 is deposited on the substrate 102, the transistor (T) and the capacitor (C) may be deteriorated by heat generated during deposition of the photoelectric conversion layer 162. However, according to an exemplary embodiment, the photoelectric conversion layer 162 may be deposited on the support substrate 180 and may then be bonded to the interlayer insulation layer 140. This may minimize deterioration of the transistor (T) and the capacitor (C) caused by heat generated during deposition of the photoelectric conversion layer 162.

Figure 8:
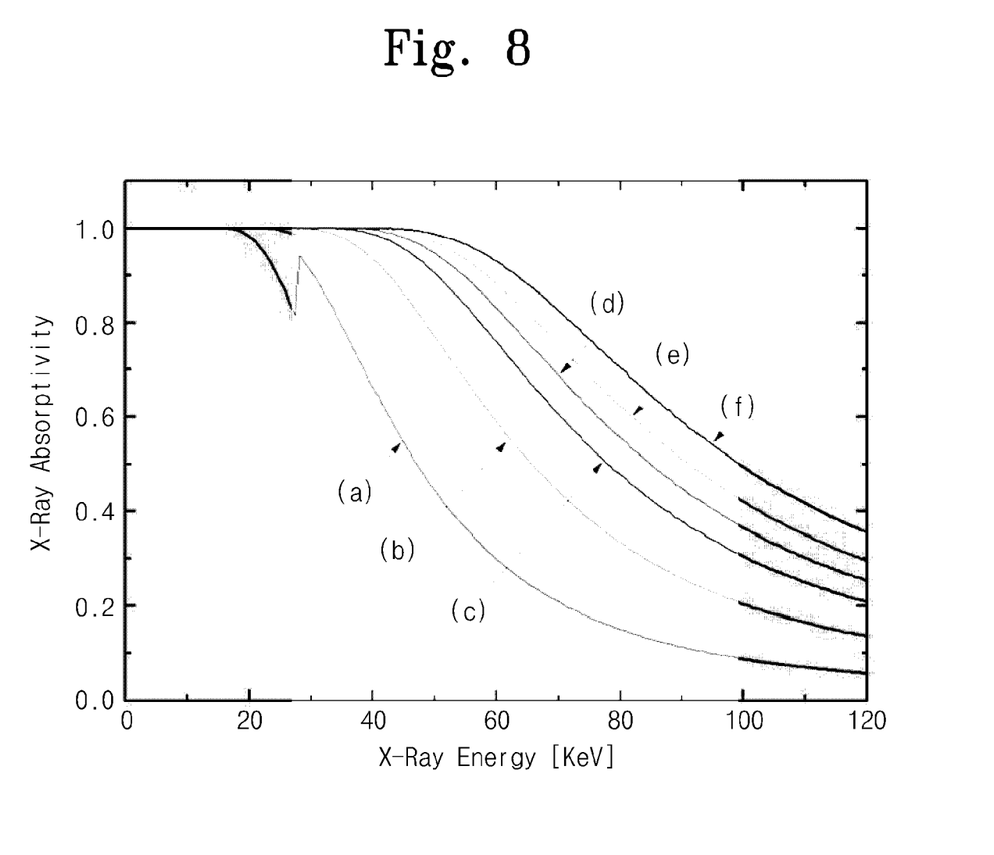
FIG. 8 is a graph showing X-ray absorptivity with respect to X-ray energy in the photoelectric conversion layers of the X-ray detection devices of the exemplary embodiments.

An explanation will now be given of the X-ray absorptivity of the photoelectric conversion layer of the X-ray detection device. FIG. 8 is a graph illustrating X-ray absorptivity with respect to X-ray energy in the photoelectric conversion layers of the X-ray detection devices of various exemplary embodiments, and FIG. 9 is a graph illustrating X-ray absorptivity with respect to X-ray energy in amorphous selenium layers.

Referring to FIG. 8, the x-axis denotes X-ray energy [KeV], and the y-axis denotes X-ray absorptivity. CIGS layers having a composition formula of $CuIn_xGa_{(1-x)}Se_2 (0<x<1)$ were formed as photoelectric conversion layers. Each of the CIGS layers had about 25 at % of copper (Cu), about 25 at % of $In_xGa_{(1-x)}$, and about 50 at % of selenium (Se). The density of the CIGS layers was about 5.71 $g/cm^3$, and the thicknesses of the CIGS layers were about 0.2 mm (a), about 0.5 mm (b), about 0.8 mm (c), about 1.0 mm (d), about 1.2 mm, and about 1.5 mm (e).

Figure 9:
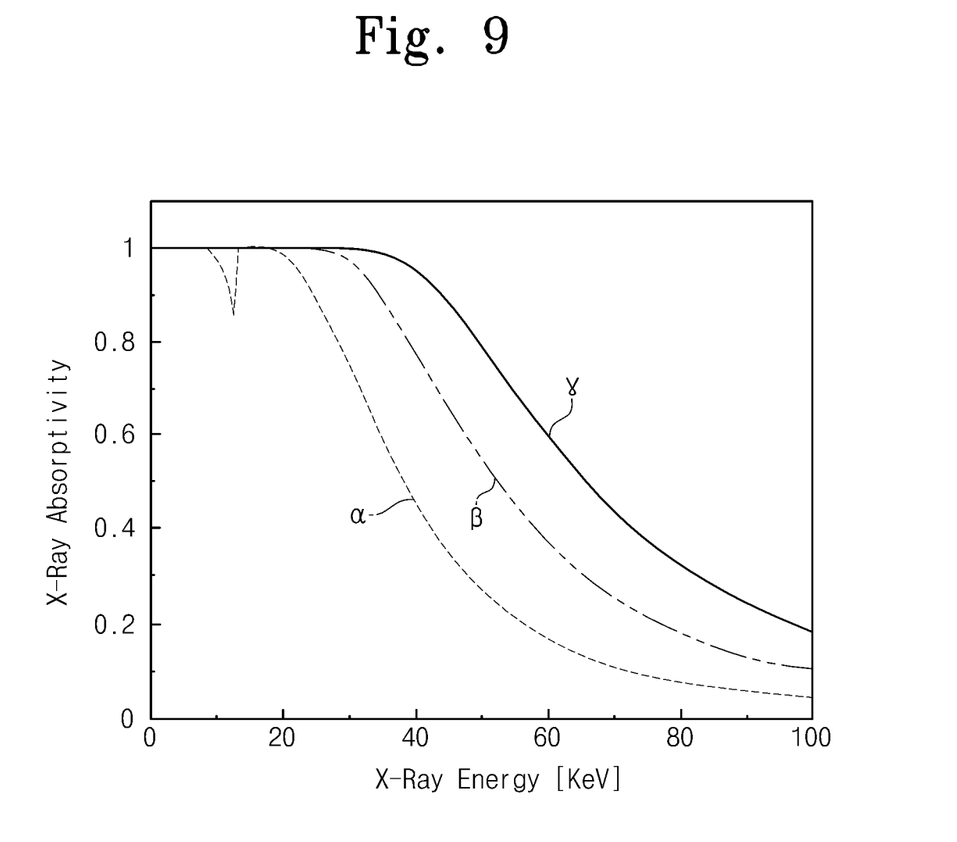
FIG. 9 is a graph showing X-ray absorptivity with respect to X-ray energy in amorphous selenium layers.

Referring to FIG. 9, the x-axis denotes X-ray energy [KeV], and the y-axis denotes X-ray absorptivity. Amorphous selenium layers having a density of about 4.81 $g/cm^3$ were formed as photoelectric conversion layers. The thicknesses of the amorphous selenium layers were about 0.2 mm ($\alpha$), about 0.5 mm ($\beta$), and about 1.0 mm ($\gamma$).

Referring to FIGS. 8 and 9, as the thicknesses of the photoelectric conversion layers increase, the X-ray absorptivity increases, and as the X-ray energy increases, the X-ray absorptivity of the photoelectric conversion layers decrease. In the same layer thickness and X-ray energy, the X-ray absorptivity of the CIGS layer is higher than the X-ray absorptivity of the selenium layer. For example, when the X-ray energy is 100 KeV, the X-ray absorptivity of the CIGS layer having a thickness of about 1 mm is about 40%, and the X-ray absorptivity of the selenium layer having a thickness of about 1 mm is about 20%. The X-ray absorptivity of the CIGS layer is about two times the X-ray absorptivity of the selenium layer.

Figure 10:
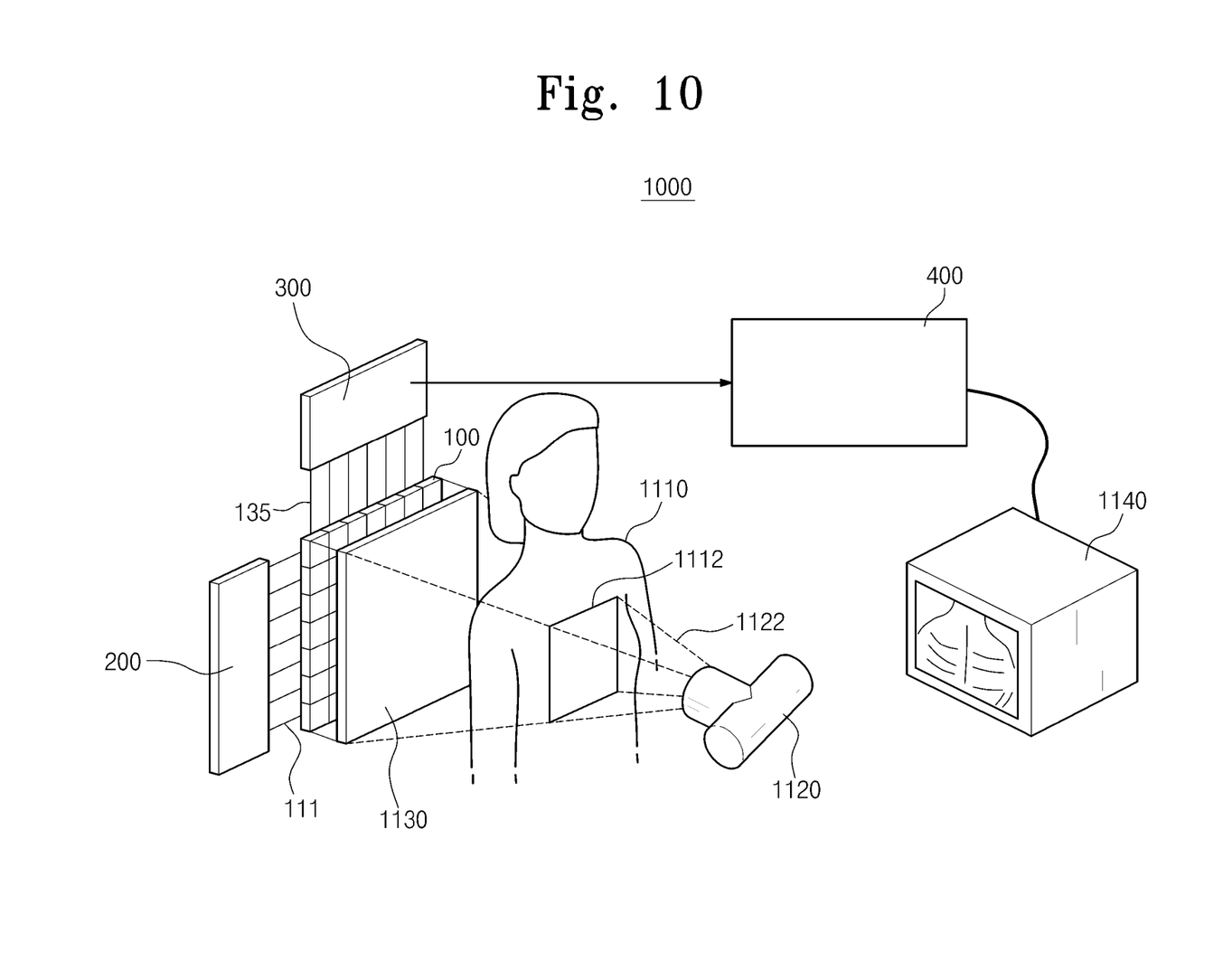
FIG. 10 is a view illustrating an X-ray system including the X-ray detection device according to exemplary embodiments.

FIG. 10 is a view illustrating an X-ray system 1000 including the X-ray detection device according to various exemplary embodiments.

Referring to FIG. 10, the X-ray system 1000 may include an X-ray generator 1120 configured to generate X-rays 1122, a detection pixel array 100 configured to detect X-rays, a gate driving unit 200 configured to drive the detection pixel array 100, a data processing unit 300 configured to process X-ray detection voltages of the detection pixel array 100, an image signal output unit 400 configured to output an image signal according to the X-ray detection voltages, and a display device 1140 configured to display images according to the image signal. The detection pixel array 100 may include the detection pixel array of the above-described embodiments.

A part 1112 of a patient 1110 may be exposed to X-rays 1122 generated from the X-ray generator 1120. The X-rays 1122 may pass through the part 1112 of the patient 1110 and reach a scintillator 1130 where the X-rays 1122 may be converted into green light. The detection pixel array 100 may be exposed to the green light.

The detection pixel array 100 may generate X-ray detection voltages corresponding to the intensities of the X-rays 1122 and may provide the X-ray detection voltages to the display device 1140 through the data processing unit 300 and the image signal output unit 400. The display device 1140 may display X-ray images corresponding to image signals in real time. In an exemplary embodiment, the display device 1140 may be a liquid crystal display (LCD).

By way of summation and review, according to exemplary embodiments, the X-ray detection device may include the photoelectric conversion layer and the capacitor. The photoelectric conversion layer may include copper (Cu), indium (In), gallium (Ga), and selenium (Se). Thus, the X-ray absorptivity of the photoelectric conversion layer may be high, and the capacitor may store a high X-ray detection voltage. Accordingly, the X-ray detection device may be operated more reliably. Embodiments relate to highly reliable and/or high-speed X-ray detection devices. Embodiments also relate to X-ray detection devices operable with low power.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:
1. An X-ray detection device, comprising:
 a gate electrode and a lower electrode on a substrate and laterally spaced from each other;
 a dielectric layer covering the gate electrode and the lower electrode;
 a conductive pattern on the dielectric layer at a side of the gate electrode adjacent to the lower electrode, the conductive pattern extending on the dielectric layer to overlap with the lower electrode;

a source electrode on the dielectric layer at the other side of the gate electrode, the source electrode being spaced apart from the conductive pattern;

an interlayer insulation layer covering the conductive pattern and the source electrode; and a collector electrode, a photoelectric conversion layer, and a bias electrode sequentially stacked on the interlayer insulation layer, wherein the photoelectric conversion layer includes copper (Cu), indium (In), gallium (Ga), and selenium (Se).

2. The X-ray detection device of claim 1, wherein the interlayer insulation layer includes a hole exposing a part of the conductive pattern, the collector electrode being substantially conformally formed on a bottom surface and sidewalls of the hole to define a space surrounded by the collector electrode in the hole.

3. The X-ray detection device of claim 2, wherein the photoelectric conversion layer fills the space surrounded by the collector electrode.

4. The X-ray detection device of claim 1, wherein:
the interlayer insulation layer includes a hole exposing the conductive pattern, and
the X-ray detection device includes a conductive adhesive material filled in the hole.

5. The X-ray detection device of claim 1, further comprising:
a gate line extending in a first direction on the substrate, the gate electrode being a portion of the gate line that is protruded from the gate line; and
a data line extending in a second direction perpendicular to the first direction on the substrate, the source electrode being a portion of the data line that is protruded from the data line.

6. An X-ray detection device, comprising:
a transistor and a capacitor on a substrate and laterally spaced from each other;
a collector electrode on the capacitor; and
a photoelectric conversion layer including $CuIn_xGa_{(1-x)}Se_2$ ($0<x<1$) on the collector electrode;
wherein the photoelectric conversion layer includes about 20 to about 30 at % of copper (Cu), about 20 to about 30 at % of $In_xGa_{(1-x)}$, and about 45 to about 55 at % of selenium (Se).

7. The X-ray detection device of claim 6, wherein a density of the photoelectric conversion layer is about 3.71 $g/cm^3$ to about 7.71 $g/cm^3$.

8. The X-ray detection device of claim 6, wherein:
the transistor includes a gate electrode on the substrate, a gate insulation layer on the gate electrode, a semiconductor pattern overlapped with the gate insulation layer, and source and drain electrodes on the semiconductor pattern at both sides of the gate electrode; and
the capacitor includes a lower electrode on the substrate, a capacitor dielectric layer on the lower electrode, and an upper electrode on the capacitor dielectric layer.

9. The X-ray detection device of claim 8, wherein the gate insulation layer and the capacitor dielectric layer are formed of a same material and provided during a same process.

10. The X-ray detection device of claim 8, wherein the source and drain electrodes and the upper electrode are formed of a same material and are provided during a same process.

11. The X-ray detection device of claim 8, wherein bottom surfaces of the gate electrode and the lower electrode are on the same level, the gate electrode and the lower electrode including different materials.

12. The X-ray detection device of claim 8, wherein the lower electrode and the collector electrode include a transparent conductive material.

13. The X-ray detection device of claim 6, further comprising a bias electrode on the photoelectric conversion layer, a voltage applied to the bias electrode being higher than a voltage applied to the collector electrode.

14. The X-ray detection device of claim 13, further comprising a buffer layer between the photoelectric conversion layer and the bias electrode, the buffer layer including a material different from the photoelectric conversion layer and the bias electrode.

15. The X-ray detection device of claim 6, wherein a thickness of the photoelectric conversion layer is about 50 μm to about 200 μm.

16. The X-ray detection device of claim 6, wherein a thickness of the photoelectric conversion layer is about 500 μm to about 2000 μm.

* * * * *